(12) United States Patent
Feuillade et al.

(10) Patent No.: US 12,055,678 B2
(45) Date of Patent: Aug. 6, 2024

(54) OPHTHALMIC LENS COMPRISING A MULTILAYERED INTERFERENTIAL COATING AND MANUFACTURING METHOD THEREOF

(71) Applicant: Essilor International, Charenton-le-pont (FR)

(72) Inventors: Mathieu Feuillade, Charenton-le-Pont (FR); Hélène Maury, Charenton-le-Pont (FR)

(73) Assignee: Essilor International, Charenton-le-pont (FR)

( * ) Notice: Subject to any disclaimer, the term of this patent is extended or adjusted under 35 U.S.C. 154(b) by 512 days.

(21) Appl. No.: 16/529,351

(22) Filed: Aug. 1, 2019

(65) Prior Publication Data
US 2020/0041697 A1 Feb. 6, 2020

(30) Foreign Application Priority Data
Aug. 2, 2018 (EP) ..................... 18306055

(51) Int. Cl.
*G02B 1/115* (2015.01)
*C23C 16/26* (2006.01)
(Continued)

(52) U.S. Cl.
CPC .............. *G02B 1/115* (2013.01); *C23C 16/26* (2013.01); *C23C 16/342* (2013.01); *G02C 7/024* (2013.01); *G02C 7/10* (2013.01)

(58) Field of Classification Search
CPC .......... G02B 1/115; G02B 1/16; G02B 1/116; G02B 5/0816; G02B 5/0858;
(Continued)

(56) References Cited

U.S. PATENT DOCUMENTS 7,903,338 B1 * 3/2011 Wach .................. A61B 5/0084
359/588
10,527,761 B2 * 1/2020 Li ........................ B82Y 20/00
(Continued)

FOREIGN PATENT DOCUMENTS

CN 102496668 6/2012
CN 104880745 9/2015
(Continued)

OTHER PUBLICATIONS

Search Report issued in Corresponding European Patent Application No. 18306055, dated Feb. 6, 2019.

*Primary Examiner* — Balram T Parbadia
*Assistant Examiner* — Gabriel A Sanz
(74) *Attorney, Agent, or Firm* — Norton Rose Fulbright US LLP

(57) ABSTRACT

This invention relates to an ophthalmic lens comprising a multilayered interferential coating and to a manufacturing method thereof.
The ophthalmic lens comprises:
an organic substrate having a front main face and a rear main face, and
a multilayered interferential coating (30) which is coated on at least one of the front main face and the rear main face,
According to the invention, the multilayered interferential coating (30) comprises at least one graphene layer (2) which has a uniform thickness of between 0,1 nm to 1 nm.

19 Claims, 6 Drawing Sheets

(51) Int. Cl.
    *C23C 16/34*     (2006.01)
    *G02C 7/02*     (2006.01)
    *G02C 7/10*     (2006.01)

(58) Field of Classification Search
    CPC ........ G02B 5/0866; G02B 1/111; G02B 1/10; G02B 1/11; G02C 7/10; G02C 7/024; G02C 7/107; G02C 7/14; G02C 7/02; C23C 16/26; C23C 16/342
    See application file for complete search history.

(56) References Cited

U.S. PATENT DOCUMENTS

| | | | |
|---|---|---|---|
| 2009/0153953 A1* | 6/2009 | Banerjee | G02B 5/0825 |
| | | | 359/359 |
| 2011/0284054 A1* | 11/2011 | Wanlass | H01L 31/04 |
| | | | 136/246 |
| 2012/0013845 A1 | 1/2012 | Conte et al. | |
| 2012/0250151 A1* | 10/2012 | Lee | H04N 13/356 |
| | | | 359/620 |
| 2013/0337161 A1* | 12/2013 | Akimoto | C09C 1/309 |
| | | | 522/170 |
| 2014/0104587 A1* | 4/2014 | Freimann | G03F 7/70308 |
| | | | 355/77 |
| 2014/0327876 A1* | 11/2014 | Hugenberg | G02B 1/14 |
| | | | 427/535 |
| 2015/0044367 A1 | 2/2015 | Sutter et al. | |
| 2016/0327691 A1* | 11/2016 | Shi | C01B 32/186 |
| 2017/0125722 A1* | 5/2017 | Wehlus | H01L 51/5275 |
| 2018/0047862 A1* | 2/2018 | Martorell Pena | H01L 31/0352 |
| 2018/0052319 A1* | 2/2018 | McCabe | G02C 11/08 |
| 2018/0067338 A1* | 3/2018 | Hofener | G02C 7/10 |
| 2018/0164606 A1* | 6/2018 | Jung | G02B 7/285 |
| 2018/0177632 A1* | 6/2018 | Herekar | A61F 9/0017 |
| 2018/0351012 A1* | 12/2018 | Xue | H01L 31/03925 |
| 2019/0033705 A1* | 1/2019 | Lee | G03F 1/64 |
| 2020/0264038 A1* | 8/2020 | Shimatani | H01L 31/0232 |
| 2021/0063609 A1* | 3/2021 | Bellman | C03C 17/3435 |

FOREIGN PATENT DOCUMENTS

| | | |
|---|---|---|
| CN | 106324731 | 1/2017 |
| EP | 3203274 | 8/2017 |
| EP | 3282292 | 2/2018 |
| WO | WO 2017/103177 | 6/2017 |

\* cited by examiner ary interferential coating or a reflective (i.e. mirror) coating.

OPHTHALMIC LENS COMPRISING A MULTILAYERED INTERFERENTIAL COATING AND MANUFACTURING METHOD THEREOF

FIELD OF THE INVENTION

The present invention relates to an ophthalmic lens comprising a multilayered interferential coating and to a manufacturing method thereof. The ophthalmic lens article may especially be a spectacle lens.

DESCRIPTION OF RELATED ART

Multilayered interferential coatings for ophthalmic lenses are well known in the art, and such coatings may for instance form an antireflection coating or a reflective (i.e. mirror) coating.

An antireflection coating usually consists of interferential thin layers, generally an alternation of layers based on a dielectric material of high refractive index and a dielectric material of low refractive index. When deposited on a transparent substrate, the function of such a coating is to reduce its light reflection and therefore to increase its light transmission. A substrate thus coated will therefore have its transmitted light/reflected light ratio increased, thereby improving the visibility of objects placed behind it. When it is sought to achieve a maximum antireflection effect, it is then preferable to provide both faces (front and rear faces) of the substrate with this type of coating.

Currently, traditional antireflective coatings are often designed and optimized to reduce reflection on the lens surface in the visible region, typically within the spectrum range of from 380 to 780 nm, but without features to limit transmission of both the near infrared (NIR) region and the ultraviolet (UV) region. To be qualified as antireflective according to ISO 8980-4 standard, such coatings must have a mean light reflection factor below 2.5%. In general, the mean light reflection factor in the visible region $R_v$ on the front and/or rear faces of an ophthalmic lens is between 1.5% to 2.5%.

A reflective coating usually consists of interferential thin layers having the opposite effect, namely increasing the light ray reflection. Such a coating type is used for example to provide solar spectacle lenses with a mirror effect.

WO 2017/103177 A1 discloses an ophthalmic lens comprising a layer of a carbon allotrope such as graphene in one of the following parts of the lens, namely the substrate, the primer or the hard multi-coat (HMC), as explained in § [00028] or [00030]. Specifically, this document teaches in § [00026] that:

the HMC may comprise at least one layer which is conductive and particularly a plurality of layers, at least one of which may comprise the carbon allotrope, and that the lens may comprise an antireflection coating (AR) that is coated on an outer surface of the HMC and that may have a multilayer configuration including a transparent conductive layer.

In other words, the multilayered interferential coating disclosed by WO 2017/103177 A1 and consisting of this antireflection coating (AR) does not contain any layer of a carbon allotrope, such as graphene, since in this document this layer of a carbon allotrope may only be present beneath the AR coating.

Graphene is known to have many beneficial properties (e.g. mechanical resistance, electrical and thermal conductivity, barrier properties) when considered as a continuous monolayer or as a stack of 3 to 5 continuous layers.

Nonetheless, a critical issue is related to the technical bias of depositing a graphene layer between layers of a stack in an ophthalmic lens while being able to keep the optical properties of the final stack compatible with the standards in ophthalmic industry, in particular the following properties for the lens:

electrical conductivity which is a desirable property to impart antistatic performance to the lens so as to avoid dust deposition, and barrier properties, especially a diffusion barrier against oxygen and/or water which is desirable in lenses comprising additives that can be oxidized (e.g. coloring agents, UV absorbers, photochromic compounds, electrochromic compounds) and also in lenses based on moisture sensitive substrates.

SUMMARY OF THE INVENTION

An object of the invention is therefore to overcome the above-mentioned technical bias by using a graphene layer in a multilayered interferential coating for an ophthalmic lens, such as an antireflection coating or a reflective coating particularly for a spectacle lens, while obtaining for this multilayered interferential coating, on the one hand, satisfactory antireflective or reflective properties over visible range or IR/NIR or UV and, on the other hand, satisfactory electrical conductivity and barrier properties for a lens incorporating this multilayered interferential coating.

For this purpose, an ophthalmic lens according to the invention comprises:

an organic substrate having a front main face and a rear main face, and a multilayered interferential coating which is coated on at least one of the front main face and the rear main face, wherein the multilayered interferential coating comprises at least one graphene layer which has a uniform thickness of between 0.1 nm to 1 nm.

As explained below, said multilayered interferential coating may be any interference coating conventionally used in the field of optics, in particular ophthalmic optics, provided that it contains at least one LI (low index) layer and at least one HI (high index) layer. Alternatively, at least one metallic layer may be used instead of at least one LI layer. For instance, the multilayered interferential coating may be, but not limited to, an antireflection coating, a reflective (mirror) coating, an infrared filter or an ultraviolet filter, but is preferably an antireflection coating or a reflective coating over the visible range, the infrared/near infrared (IR/NIR) range or even the ultraviolet (UV) range.

It may be noted that said multilayered interferential coating may be formed on at least one of the main faces of the bare substrate (i.e. an uncoated substrate), or on at least one of the main faces of a substrate already coated with one or more functional coatings, such as an anti-abrasion coating.

As used herein, the rear (i.e. inner) face of the substrate is intended to mean the face which, when using the lens, is the nearest from the wearer's eye. It is generally a concave face. On the contrary, the front face of the substrate, is the face which, when using the lens, is the most distant from the wearer's eye. It is generally a convex face.

Generally speaking, said interferential multilayered coating may be deposited onto any organic substrate, and preferably onto a thermoplastic or thermosetting plastic material.

It is also to be noted that by "graphene layer" means in the present description that the at least one layer exclusively consists of graphene (i.e. according to a weight fraction of graphene in the at least one layer equal to 100%).

By "uniform thickness", it is meant in the present description that the thickness of the or each graphene layer varies in a range of 0.2 nm around the average layer thickness (i.e. average layer thickness ±0.2 nm).

The use of said at least one graphene layer in the interferential stack of the present invention allows to take advantage of the above-mentioned antistatic and barrier properties (e.g. diffusion barrier against oxygen and/or water).

According to another feature of the invention, the multilayered interferential coating may form a stack comprising inorganic dielectric thin layers and the at least one graphene layer, and the multilayered interferential coating preferably comprises at least two said graphene layers.

It will be noted that the inorganic dielectric layers of this stack of the invention are by definition not electrically conductive, contrary to the conductive layers included in the stack disclosed by document WO 2017/103177 A1.

Unless stated otherwise, all thicknesses disclosed in the present application relate to physical thicknesses.

It is to be noted that the at least one graphene layer may be preferably deposited by forming a monolayer or a bilayer of graphene, each having more preferably a thickness of between 0.2 nm and 0.4 nm and even more preferably a monolayer having a thickness greater than or equal to 0.2 nm and less than 0.3 nm.

According to still another feature of the invention, the multilayered interferential coating may form a stack comprising an alternation of:
at least one high refractive layered unit of refraction index greater than 1.55, and of
at least one layer selected from a low refractive layer of refraction index lower than 1.55 and a metallic layer.

Unless otherwise indicated, the refractive indices to which reference is made in the present application are expressed at 25° C. for a wavelength of 550 nm.

By way of metallic layer, a layer of at least one metal selected among silver (Ag), gold (Au) and copper (Cu) is preferred.

Still advantageously, the at least one high refractive layered unit may comprise:
the at least one graphene layer,
an underlying encapsulating layer over which the at least one graphene layer continuously extends, said underlying encapsulating layer having preferably a thickness of between 5 nm and 85 nm, and further optionally
an overlying encapsulating layer beneath which the at least one graphene layer continuously extends, said overlying encapsulating layer having preferably a thickness of less than 80 nm.
and wherein said at least one high refractive layered unit has preferably a thickness of between 10 nm to 120 nm.

It is to be noted that such a reduced thickness of 10-120 nm for the at least one high refractive layered unit included in the multilayered interferential coating is a preferred feature for the ophthalmic lens of the invention.

Also preferably, each of the underlying encapsulating layer and of the overlying encapsulating layer is based of boron nitride (BN), even more preferably hexagonal boron nitride.

It will be noted that the use of BN encapsulating layer(s) enhances the stability of the or each graphene layer, because the crystallographic structure of BN advantageously matches the specific crystallographic structure of graphene.

This encapsulation enables to preserve the physical properties of graphene. In addition, boron nitride allows passivation of the at least one graphene layer.

Preferably, the "relative light transmission factor in the visible spectrum" of the ophthalmic lens, noted $T_v$, as defined in the standard NF EN 1836 (see the examples below), is greater than 50%, more preferably greater than 80%.

According to a first embodiment of the invention, the at least one high refractive layered unit comprises the underlying encapsulating layer and the overlying encapsulating layer sandwiching a said graphene layer, the multilayered interferential coating successively comprising, in a direction moving away from the organic substrate, at least one unitary assembly of:
one said high refractive layered unit which preferably a thickness of between 10 nm to 120 nm, and of
one said low refractive layer which covers the said high refractive layered unit, which is preferably based on $SiO_2$ and preferably has a thickness of between 10 nm and 180 nm,
the multilayered interferential coating having a said high refractive layered unit as a bottom layer and one said low refractive layer as a top layer, and comprising a number of said unitary assembly(ies) ranging from 1 to 8, preferably from 1 to 5.

More preferably, said low refractive layer based on silica comprises silica according to a weight fraction greater than 70%, still more preferably greater than 90%.

Advantageously in this first embodiment, the multilayered interferential coating may form a visible antireflection coating and/or an infrared reflective coating for a spectacle lens.

Even more advantageously in this first embodiment, the multilayered interferential coating may then form a visible antireflection coating having a mean light reflection factor in the visible region $R_v$ lower than or equal to 1.1% and preferably to 1.02% for an angle of incidence of 15°.

Also advantageously in this first embodiment, the multilayered interferential coating may form an infrared reflective coating having an IR reflection factor $R_{IR}$ measured across 780-2000 nm greater than or equal to 30% and preferably to 40%, measured at an angle of incidence of 15°.

It will be noted that this first embodiment of the invention may generally encompass for both the reflective and anti-reflection coatings either the UV spectrum with a wavelength between 280 and 380 nm, the visible spectrum with a wavelength between 380 and 780 nm, the NIR spectrum (also called IR-A) with a wavelength between 780 nm and 1400 nm, or the whole IR spectrum with a wavelength between 780 nm and 2000 nm.

According to a second embodiment of the invention, the multilayered interferential coating successively comprises, in a direction moving away from the organic substrate:
as a bottom layer, one lower said high refractive layered unit which comprises the underlying encapsulating layer and the overlying encapsulating layer sandwiching a said graphene layer, and said lower high refractive layered unit preferably has a thickness of between 20 nm and 70 nm,
one said layer selected from a low refractive layer and a metallic layer which covers the said lower high refractive layered unit and which is preferably:
a $SiO_2$ layer having a thickness of between 120 nm and 170 nm, or
a metallic layer having a thickness of between 5 nm and 15 nm, and as a top layer, one said graphene layer extending over one said underlying encapsulating layer to form an upper said high refractive layered unit which is devoid of a said overlying encapsulating layer and which preferably has a thickness of between 40 nm and 60 nm, the number of said graphene layers in the multilayered interferential coating ranging from 1 to 8, preferably from 1 to 5.

Advantageously in this second embodiment, the multilayered interferential coating may form:

(i) where said layer which covers the said lower high refractive layered unit is a low refractive $SiO_2$ layer, a visible reflective coating forming a mirror front surface of a spectacle lens which is preferably a solar spectacle lens, and (ii) where said layer which covers the said lower high refractive layered unit is a metallic layer, a visible antireflection coating and/or an infrared reflective coating.

Even more advantageously in this second embodiment:

in case (i) the multilayered interferential coating may form a visible reflecting coating having a mean light reflection factor in the visible region $R_v$ greater than or equal to 20% and preferably to 30% for an angle of incidence of 15°, and in case (ii) the multilayered interferential coating may form:

a visible antireflection coating having a mean light reflection factor in the visible region $R_v$ lower than or equal to 1% and preferably to 0.8% for an angle of incidence of 15°, and an infrared reflective coating having an IR reflection factor $R_{IR}$ measured across 780-2000 nm greater than or equal to 30% and preferably to 35%, measured at an angle of incidence of 15°.

It will be noted that this second embodiment of the invention may generally encompass for both the reflective and antireflection coatings either the UV spectrum with a wavelength between 280 and 380 nm, the visible spectrum with a wavelength between 380 and 780 nm, the NIR spectrum with a wavelength between 780 nm and 1400 nm, or the IR spectrum with a wavelength between 780 nm and 2000 nm.

In other words, a multilayered interferential coating according to the invention may form either an antireflection coating or a reflective (i.e. mirror) coating, in both cases over the visible range, the IR/NIR range or even the UV range.

Considering that each monolayer of graphene decreases the transmission level by a factor of 2.3%, it is beneficial to preferably limit the number of graphene layers for the multilayered interferential coating of the invention (including both first and second embodiments) below 5, ideally below 3, even better to a single monolayer of graphene.

Advantageously, an ophthalmic lens of the invention may for example be a photochromic lens or an active spectacle lens comprising an electroactive material, such as a liquid crystal (LC) material, and an electrochromic material.

Specifically, the use of the at least one graphene layer may be beneficial to avoid the diffusion of oxygen or moisture in photochromic lenses or active lenses (e.g. LC lenses or electrochromic lenses) that may see their photo- or electro-responsive properties deteriorate, for example due to oxidation of their active elements (e.g. photochromes or LC) or to the modification of ions concentration in the medium.

On active lenses, graphene could be used both as diffusion barrier layer and thermal conductor to homogenize the temperature of the LC or electrochromic layer, especially when these layer are liquid or gel. In fact, liquid or gel mixtures are known to be sensitive to the diffusion of moisture, which is damageable for the response time and to the temperature which can impact the LC phase or the refractive index or the electrochemical properties. If heaters are used to control the mixture temperature, it can also be beneficial to use graphene to homogenize the temperature on the full lens surface.

A method for manufacturing an ophthalmic lens as defined above, i.e. comprising:

an organic substrate having a front main face and a rear main face, and a multilayered interferential coating which is coated on at least one of the front main face and the rear main face, the multilayered interferential coating comprising at least one graphene layer, is characterized in that the method comprises depositing on the organic substrate said multilayered interferential coating by chemical vapor deposition.

Optionally, interferential coating may be prepared by chemical vapor deposition on a temporary substrate, then transferred from the temporary substrate on the organic substrate.

BRIEF DESCRIPTION OF THE DRAWINGS

The present invention will be described in more detail by referring to the appended drawings, wherein.

DETAILED DESCRIPTION OF THE INVENTION AND PREFERRED EMBODIMENTS

Figure 1:
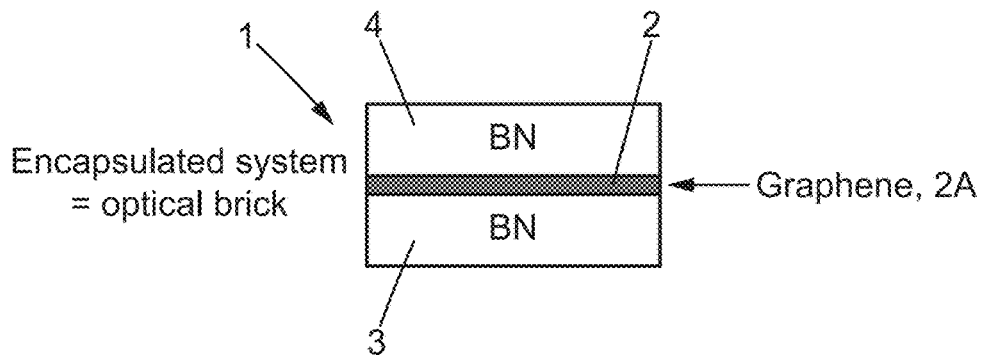
FIG. 1 diagrammatically shows the structure of a high refractive layered unit usable in a multilayered interferential coating according to said first embodiment of the invention.

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof, such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises," "has," "contains," or "includes" one or more steps or elements possesses those one or more steps or elements, but is not limited to possessing only those one or more steps or elements.

Unless otherwise indicated, all numbers or expressions referring to quantities of ingredients, ranges, reaction conditions, etc. used herein are to be understood as modified in all instances by the term "about."

Also unless otherwise indicated, the indication of an interval of values «from X to Y» or "between X to Y", according to the present invention, means as including the values of X and Y.

In the present application, when an ophthalmic lens comprises one or more coatings onto the surface thereof, the expression "to deposit a layer or a coating onto the lens" is intended to mean that a layer or a coating is deposited onto the external (exposed) surface of the outer coating of the lens, that is to say its coating that is the most distant from the substrate.

A coating, that is said to be "on" a substrate or deposited "onto" a substrate is defined as a coating, which (i) is positioned above the substrate, (ii) is not necessarily in contact with the substrate, that is to say one or more intermediate coatings may be arranged between the substrate and the coating in question, and (iii) does not necessarily completely cover the substrate.

In a preferred embodiment, the coating on a substrate or deposited onto a substrate is in direct contact with this substrate.

When "a layer 1 is lying under a layer 2", it is intended to mean that layer 2 is more distant from the substrate than layer 1.

As used herein, the rear (or the inner) face of the substrate is intended to mean the face which, when using the lens, is the nearest from the wearer's eye. It is generally a concave face. On the contrary, the front face of the substrate, is the face which, when using the lens, is the most distant from the wearer's eye. It is generally a convex face.

The ophthalmic lens prepared according to the present invention may be a transparent ophthalmic lens or a lens blank thereof. The lens may be coated on its convex main side (front side), concave main side (back side), or both sides according to the invention.

Thermoplastic materials usable for the organic substrate may be selected from, for instance: polyamides; polyimide; polysulfones; polycarbonates and copolymers thereof; poly (ethylene terephtalate) and polymethylmethacrylate (PMMA).

As used herein, a polycarbonate (PC) is intended to mean either homopolycarbonates or copolycarbonates and block copolycarbonates.

Thermoset materials usable for the substrate may be selected from, for instance: cycloolefin copolymers such as ethylene/norbornene or ethylene/cyclopentadiene copolymers; homo- and copolymers of allyl carbonates of linear or branched aliphatic or aromatic polyols, such as homopolymers of diethylene glycol bis(allyl carbonate) (CR 39®); homo- and copolymers of (meth)acrylic acid and esters thereof, which may be derived from bisphenol A; polymer and copolymer of thio(meth)acrylic acid and esters thereof, polymer and copolymer of allyl esters which may be derived from Bisphenol A or phtalic acids and allyl aromatics such as styrene, polymer and copolymer of urethane and thiourethane, polymer and copolymer of epoxy, and polymer and copolymer of sulphide, disulfide and episulfide, and combinations thereof.

Homopolymers of diethylene glycol bis(allyl carbonate) (CR 39®), allylic and (meth)acrylic copolymers, having a refractive index between 1.54 and 1.58, are preferred.

As used herein, a (co)polymer is intended to mean a copolymer or a polymer. As used herein, a (meth)acrylate is intended to mean an acrylate or a methacrylate.

Particularly recommended substrates include those substrates obtained through (co)polymerization of the diethyleneglycol bis-allyl-carbonate, marketed, for example, under the trade name CR-39® by the PPG Industries company (ORMA® lenses, ESSILOR), or polythiourethanes/polysulfides, marketed for instance under MR series by Mitsui, or allylic and (meth)acrylic copolymers, having a refractive index between 1.54 and 1.58.

Prior to depositing the multilayered interferential coating onto the optionally coated substrate, for example with an abrasion-resistant layer and/or a scratch-resistant coating or with a sub-layer, the surface of said optionally coated substrate is usually submitted to a physical or chemical surface activating treatment, so as to reinforce the adhesion of the antireflective coating. Such pre-treatment is generally conducted under vacuum. It may be a bombardment with energetic and/or reactive species, for example with an ion beam ("Ion Pre-Cleaning" or "IPC") or with an electron beam, a corona discharge treatment, an ion spallation treatment, an ultraviolet treatment or a plasma-mediated treatment under vacuum, generally using an oxygen or an argon plasma. It may also be an acid or basic treatment and/or a solvent-based treatment (water, hydrogen peroxide or any organic solvent).

The multilayered interferential coating may be deposited onto a sub-layer, which then does not belong to the multilayered interferential coating.

Because of its relatively high thickness, the sub-layer does not generally take part to the antireflective optical activity, especially when it has a refractive index close to that of the underlying coating (which is generally the anti-abrasion and anti-scratch coating) or to that of the substrate, if the sub-layer is directly deposited onto the substrate.

The sub-layer should have a thickness that is sufficient for promoting the abrasion resistance of the antireflective coating, but preferably not to such an extent that a light absorption could be caused, which, depending on the sub-layer nature, could significantly reduce the relative transmission factor $\tau_v$. Its thickness is generally lower than 300 nm, more preferably lower than 200 nm, and is generally higher than 90 nm, more preferably higher than 100 nm.

The sub-layer preferably comprises a $SiO_2$-based layer, this layer comprising preferably at least 80% by weight of silica, more preferably at least 90% by weight of silica, relative to the layer total weight, and even more preferably consists in a silica layer. The thickness of such silica-based layer is generally lower than 300 nm, more preferably lower than 200 nm, and is generally higher than 90 nm, more preferably higher than 100 nm.

The ophthalmic lens of the invention may contain an additional antistatic layer (i.e. in addition to a graphene layer), so as not to retain and/or develop a substantial static charge, by incorporating at least one charge dissipating conductive layer into the stack present on the surface of the lens.

The ability for a glass to evacuate a static charge obtained after rubbing with a piece of cloth or using any other procedure to generate a static charge (charge applied by corona . . . ) may be quantified by measuring the time it takes for said charge to dissipate. Thus, antistatic glasses have a discharge time of about a few hundred milliseconds, preferably 500 ms or less, whereas it is of about several tens of seconds for a static glass. In the present application, discharge times are measured according to the method exposed in the French application FR 2 943 798.

As used herein, an "electrically conductive layer" or an "antistatic layer" is intended to mean a layer which, due to its presence on the surface of a non-antistatic substrate (i.e. having a discharge time higher than 500 ms), enables to have a discharge time of 500 ms or less after a static charge has been applied onto the surface thereof.

The electrically conductive layer may be located on various places in the stack, generally in or in contact with the antireflective coating, provided the anti-reflective properties thereof are not affected. It is preferably located between two layers of the antireflective coating, and/or is adjacent to a layer with a high refractive index of such antireflective coating. Preferably, the electrically conductive layer is located immediately under a layer with a low refractive index of the antireflective coating, most preferably is the penultimate layer of the antireflective coating by being located immediately under the silica-based outer layer of the antireflective coating.

The low refractive layers (e.g. $SiO_2$ layers) are preferably deposited by chemical vapor deposition, under vacuum, according to any of the following methods: i) by optionally ion-beam assisted, evaporation; ii) by ion-beam sputtering; iii) by cathode sputtering; iv) by plasma-assisted chemical vapor deposition. These various methods are described in the following references "Thin Film Processes" and "Thin Film Processes II," Vossen & Kern, Ed., Academic Press, 1978 and 1991, respectively. A particularly recommended method is the evaporation under vacuum.

Generally, the front and/or rear main face of the substrate onto which an antireflective coating will be deposited is coated with an impact-resistant primer layer, with an anti-abrasion and/or anti-scratch coating, or with an impact-resistant primer layer coated with an anti-abrasion and/or anti-scratch coating.

The anti-abrasion and/or scratch-resistant coatings are preferably hard coatings based on poly(meth)acrylates or silanes, generally comprising one or more mineral fillers intended to increase the hardness and/or the refractive index of the coating once cured.

Hard anti-abrasion and/or scratch-resistant coatings are preferably prepared from compositions comprising at least one alkoxysilane and/or a hydrolyzate thereof, obtained for example through hydrolysis with a hydrochloric acid solution and optionally condensation and/or curing catalysts.

The anti-abrasion and/or scratch-resistant coating composition may be deposited onto the main face of the substrate by dip- or spin-coating. It is then cured by a suitable method (preferably using heat or ultraviolet radiation).

The thickness of the anti-abrasion and/or scratch-resistant coating does generally vary from 2 to 10 μm, preferably from 3 to 5 μm.

Prior to depositing the abrasion-resistant coating and/or the scratch-resistant coating, it is possible to apply onto the substrate a primer coating to improve the impact resistance and/or the adhesion of the subsequent layers in the final product. This coating may be any impact-resistant primer layer traditionally used for articles in a transparent polymer material, such as ophthalmic lenses.

An ophthalmic lens according to the invention may also comprise coatings formed on the multilayered interferential coating and capable of modifying the surface properties thereof, such as hydrophobic and/or oleophobic coatings (antifouling top coat). These coatings are preferably deposited onto the outer layer of the multilayered interferential coating, in particular when the outer layer of the multilayered interferential coating is silica based. As a rule, their thickness is lower than or equal to 10 nm, does preferably range from 1 to 10 nm, more preferably from 1 to 5 nm.

Instead of the hydrophobic coating, a hydrophilic coating may be used which provides antifog properties, or an antifog precursor coating which provides antifog properties when associated with a surfactant. Examples of such antifog precursor coatings are described in the patent application WO 2011/080472.

An ophthalmic lens of the invention may be a spectacle lens such as a polarized lens, a photochromic lens or a solar lens, which may be tinted or not, be corrective, or not.

This ophthalmic lens may be inserted in spectacle frames or in a head mounted device. Non limiting examples of head mounted devices include immersive and non-immersive devices, in particular see-through devices and see-around devices. Head mounted devices may be either augmented reality devices or virtual reality devices.

The front face and/or the rear face of the substrate of the lens may be successively coated with an impact-resistant primer layer, an abrasion-resistant layer and/or a scratch-resistant layer, said multilayered interferential coating of the invention, and with a hydrophobic and/or oleophobic coating.

The following examples illustrate the present invention in a more detailed, but non-limiting manner.

Examples

Figure 4A:
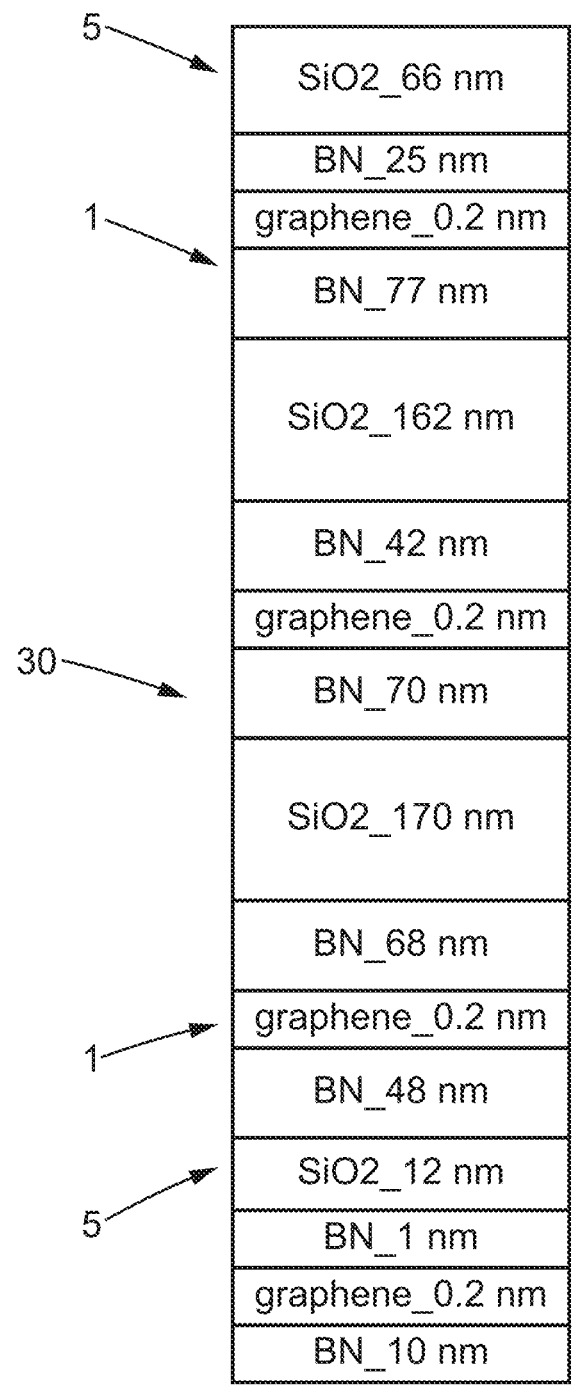
FIG. 4a diagrammatically shows the structure of a multilayered interferential coating according to a third example of said first embodiment including four high refractive layered units of FIG. 1 respectively coupled to four low refractive layers.
Figure 4B:
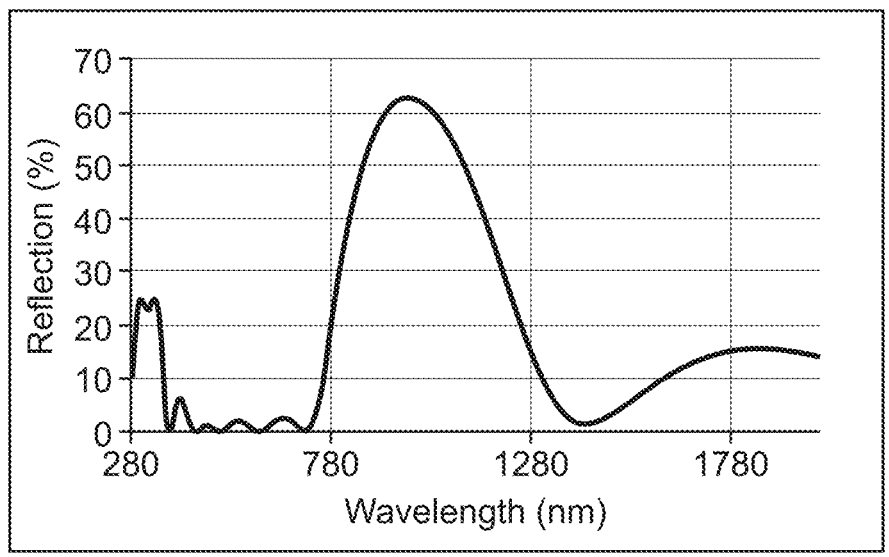
FIG. 4b shows for the multilayered interferential coating of FIG. 4a the variation of the reflection (R) on the front face surface thereof at an angle of incidence θ of 15°, as a function of the wavelength in the UV, visible and IR ranges.
Figure 5:
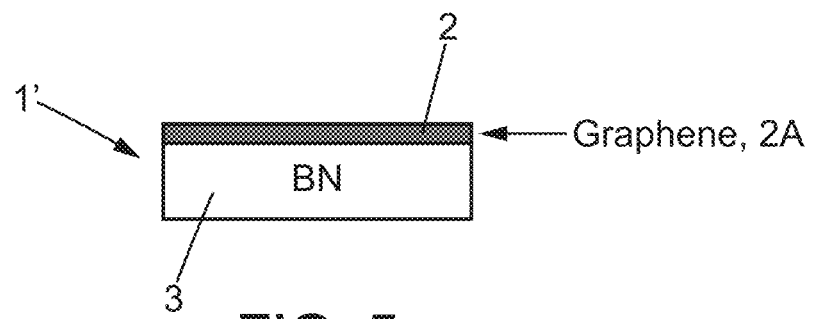
FIG. 5 diagrammatically shows the structure of a high refractive layered unit usable in a multilayered interferential coating according to said second embodiment of the invention.
Figure 6A:
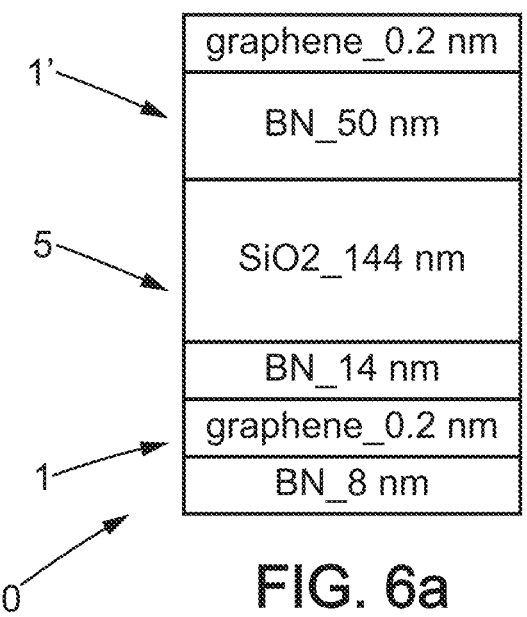
FIG. 6a diagrammatically shows the structure of a multilayered interferential coating according to a first example of said second embodiment including one high refractive layered unit of FIG. 1 coupled to one low refractive layer, the stack being topped by the high refractive layered unit of FIG. 5.
Figure 6B:
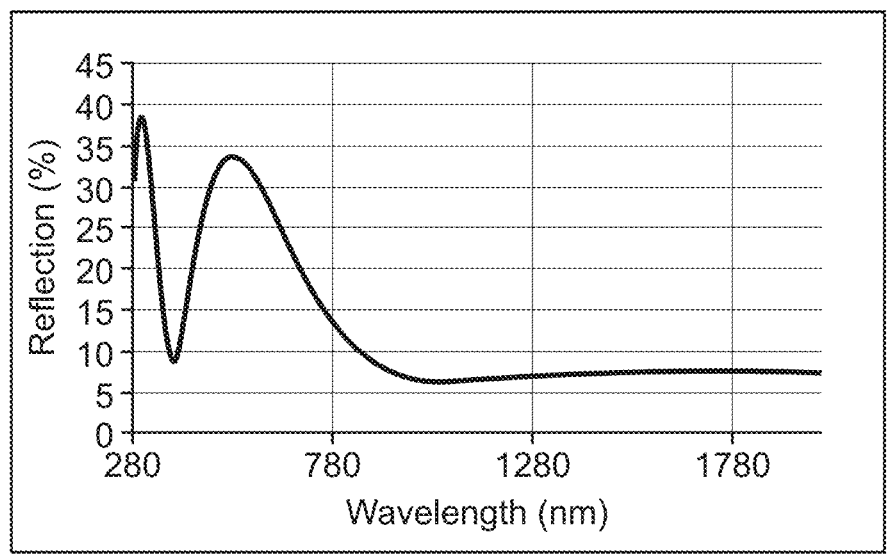
FIG. 6b shows for the multilayered interferential coating of FIG. 6a the variation of the reflection (R) on the front face surface thereof at an angle of incidence θ of 15°, as a function of the wavelength in the UV, visible and IR ranges.
Figure 7A:
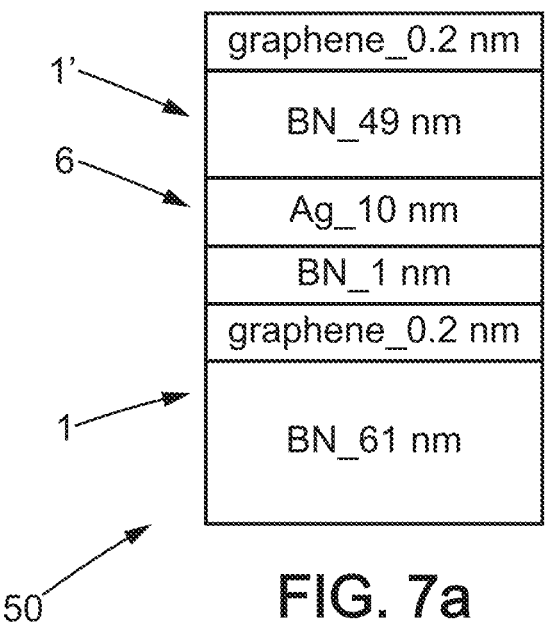
FIG. 7a diagrammatically shows the structure of a multilayered interferential coating according to a second example of said second embodiment including one high refractive layered unit of FIG. 1 coupled to one metallic layer, the stack being topped by the high refractive layered unit of FIG. 5.
Figure 7B:
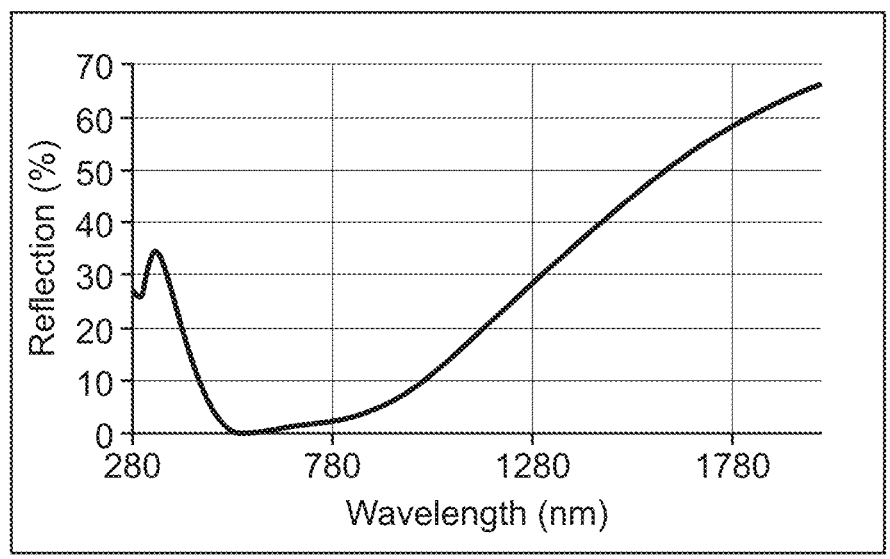
FIG. 7b shows for the multilayered interferential coating of FIG. 7a the variation of the reflection (R) on the front face surface thereof at an angle of incidence θ of 15°, as a function of the wavelength in the UV, visible and IR ranges.

Graphene was used for the following simulations in the form of a single monolayer sheet 2 sandwiched in boron nitride (BN) layers 3 and 4 (see FIGS. 1, 2a, 3a, 4a), or only deposited on one BN layer 3 (see FIGS. 5, 6a, 7a).

The optical properties of graphene (refractive index and absorption coefficient, both as functions of wavelength) were extrapolated from tabulated graphite properties.

A graphene monolayer 2 having a thickness of 2 Å was put in sandwich between BN layers 3 and 4. For the simulations, we have considered the 280-2000 nm domain which is relevant regarding applications in UV, visible and IR ranges. To our knowledge, no optical index of single graphene sheet is mentioned in the literature. We therefore used the optical index of graphite for the simulations. The BN material displays an optical index very close to those of transparent high index materials like $ZrO_2$. In terms of optical properties, the high refractive layered units 1 and 1' of FIGS. 1 and 5 behave like classical high index materials, namely graphene does not modify interferential properties but displays a significant amount of absorption (about 2% of absorption per graphene sheet).

During the optimization carried out by the applicant, the thicknesses of the BN layers 3 and 4 were variables, and different kind of multilayered interferential coatings 10, 20, 30, 40, 50 according to the invention were designed in FIGS. 2a, 3a, 4a, 6a, 7a for the front main face of an ophthalmic lens (whereas the rear main face may be provided with a conventional multilayered interferential coating of the prior art).

The lenses where prepared with an organic lens substrate ORMA® (obtained by polymerizing a diethylene glycol bis(allyl carbonate), typically CR39®) having a 65 mm diameter, a refractive index in the range of around 1.5, and a power of −2.00 diopters. The multilayered interferential coating according to invention was deposited on front face. A multilayered interferential coating corresponding to example 1 of WO2012076714 was deposited on rear face.

The "mean light reflection factor," noted $R_v$, is such as defined in the ISO 13666:1998 Standard, and measured in accordance with the ISO 8980-4, i.e. this is the weighted spectral reflection average over the whole visible spectrum between 380 and 780 nm. $R_v$ was measured for an angle of incidence of 15° on front face.

The "relative light transmission factor in the visible spectrum", noted $T_v$, is such as defined in the standard NF EN 1836 and relates to an average in the 380-780 nm wavelength range that is weighted according to the sensitivity of the eye at each wavelength of the range and measured under D65 illumination conditions (daylight).

The IR reflection factor $R_{IR}$ was measured across 780-2000 nm at an angle of incidence of 15°.

The colorimetric coefficients of the lenses refer to reflected light on front face, in the international colorimetric system CIE L*a*b* and are calculated between 280 and 780 nm, taking the standard illuminant D 65 and the observer into account (angle of 10°). The observer is a "standard observer" as defined in the international colorimetric system CIE L*a*b*.

1) The high refractive layered unit 1 of FIG. 1 comprised a graphene layer 2 sandwiched between an underlying BN encapsulating layer 3 and an overlying BN encapsulating layer 4.

Figure 2A:
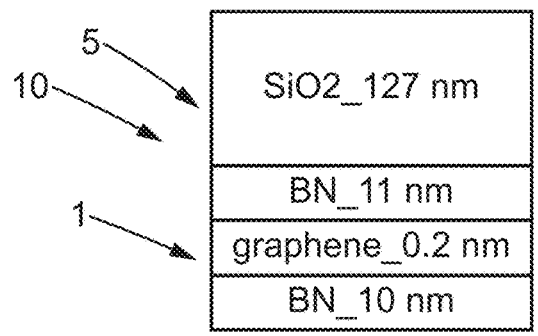
FIG. 2a diagrammatically shows the structure of a multilayered interferential coating according to a first example of said first embodiment including one high refractive layered unit of FIG. 1 coupled to one low refractive layer.
Figure 2B:
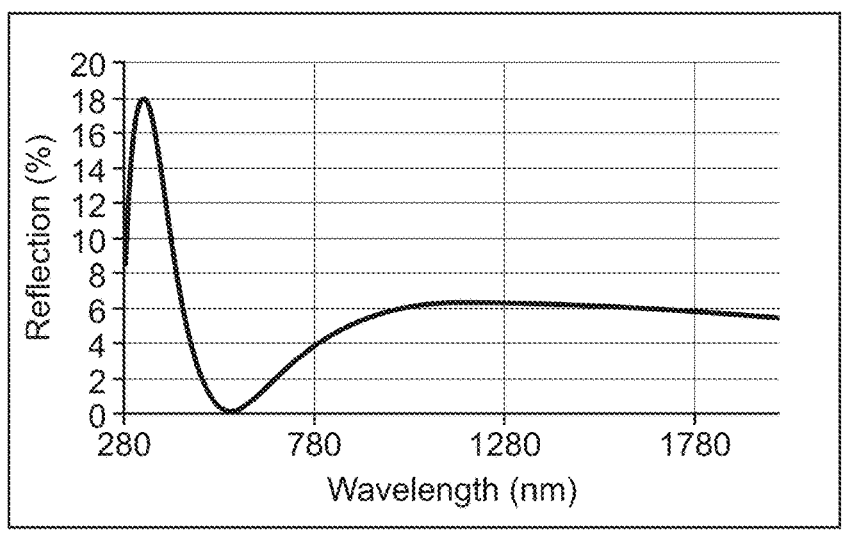
FIG. 2b shows for the multilayered interferential coating of FIG. 2a the variation of the reflection (R) on the front face surface thereof at an angle of incidence θ of 15°, as a function of the wavelength in the UV range (280 to 380 nm), in the visible range (380 to 780 nm) and in the IR range (780 to 2000 nm)

1.1) The multilayered interferential coating 10 of FIG. 2a, which was designed to be an antireflection coating in the front main face, successively comprised, in a direction moving away from the organic substrate (not visible, see respective thicknesses in FIG. 2a):

one high refractive layered unit 1 of FIG. 1, and
one low refractive layer 5 which covered the high refractive layered unit 1 and which was based on $SiO_2$.

The optical performances of coating 10 were as indicated below:

| $R_v$ = 0.55% | $T_v$ = 97.3% | C* = 41 | h = 305° |

Figure 3A:
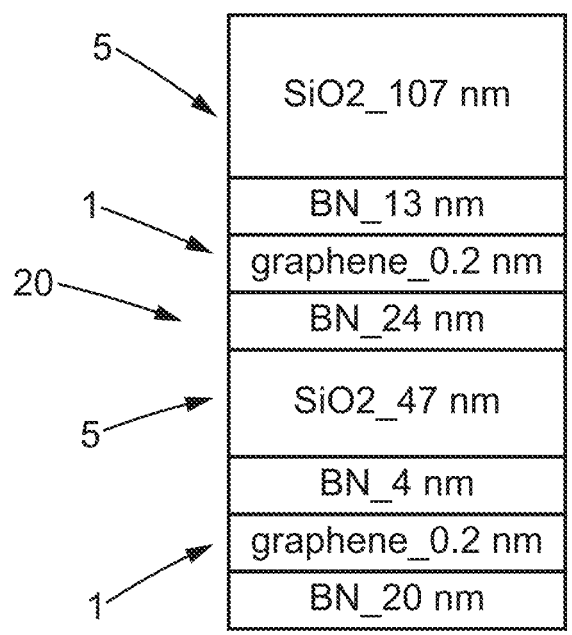
FIG. 3a diagrammatically shows the structure of a multilayered interferential coating according to a second example of said first embodiment including two high refractive layered units of FIG. 1 respectively coupled to two low refractive layers.
Figure 3B:
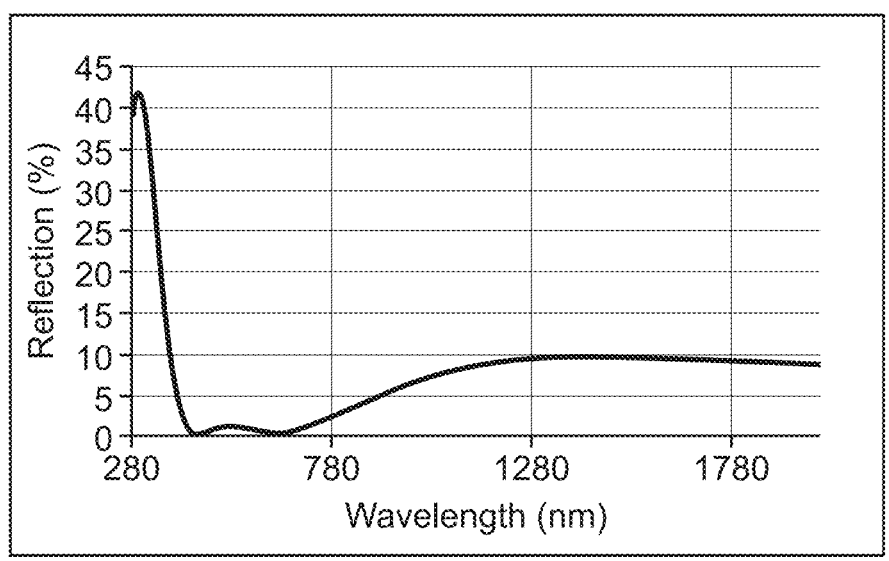
FIG. 3b shows for the multilayered interferential coating of FIG. 3a the variation of the reflection (R) on the front face surface thereof at an angle of incidence θ of 15°, as a function of the wavelength in the UV, visible and IR ranges.

1.2) The multilayered interferential coating 20 of FIG. 3a, which was also designed to be an antireflection coating in the front main face, successively comprised, in a direction moving away from the organic substrate (not visible, see respective thicknesses in FIG. 3a):

two high refractive layered units 1 of FIG. 1, and
two low refractive layers 5 which respectively covered the high refractive layered units 1 and which were each based on $SiO_2$.

The optical performances of coating 20 were as indicated below:

| $R_v$ = 0.98% | $T_v$ = 95.9% | C* = 11 | h = 135° |

1.3) The multilayered interferential coating 30 of FIG. 4a, which was particularly designed to be a visible antireflection coating and also a high NIR reflective coating both in the front main face, successively comprised, in a direction moving away from the organic substrate (not visible, see respective thicknesses in FIG. 4a):

four high refractive layered units 1 of FIG. 1, and
four low refractive layers 5 which respectively covered the high refractive layered units 1 and which were each based on $SiO_2$.

The optical performances of coating 30 were as indicated below:

| $R_v$ = 1.02% | $T_v$ = 94.5% | $R_{IR}$ (780-1400 nm) 40% |

2) The high refractive layered unit 1' of FIG. 5 comprised a graphene layer 2 deposited over an underlying BN encapsulating layer 3, without being surmounted by an overlying BN encapsulating layer 4.

2.1) The multilayered interferential coating 40 of FIG. 6a, which was designed to be a reflective coating in the front main face (e.g. usable for mirror sunglasses), successively comprised, in a direction moving away from the organic substrate (not visible, see respective thicknesses in FIG. 6a):

one high refractive layered unit 1 of FIG. 1,
one low refractive layer 5 which covered the high refractive layered unit 1 and which was based on $SiO_2$, and
the high refractive layered unit 1' of FIG. 5 at the top of the interferential coating 40.

The optical performances of coating 40 were as indicated below:

| $R_v$ = 32% | $T_v$ = 67% | C* = 14 | h = 135° |

In this configuration a flash deposition of an $SiO_2$ layer with a thickness below 5 nm could be additionally performed in order to allow a subsequent deposition of a fluorinated coating surmounting the interferential coating 40 to impart easy cleaning properties to the ophthalmic lens.

2.2) The multilayered interferential coating 50 of FIG. 7a, which was designed to be a visible antireflection coating and also an IR reflective coating in the front main face, successively comprised, in a direction moving away from the organic substrate (not visible, see respective thicknesses in FIG. 7a):
- one high refractive layered unit 1 of FIG. 1,
- one metallic layer 6 which covered the high refractive layered unit 1 and which was made of silver (Ag) in this example, and
- the high refractive layered unit 1' of FIG. 5 at the top of the interferential coating 50.

The optical performances of coating 50 were as indicated below:

| $R_v = 0.8\%$ | $T_v = 92.5\%$ | $R_{IR}$ (780-2000 nm) 35% |
|---|---|---|

In this configuration a flash deposition of an $SiO_2$ layer with a thickness below 5 nm could be additionally performed in order to allow a subsequent deposition of a fluorinated coating surmounting the interferential coating 40 to impart easy cleaning properties to the ophthalmic lens.

The invention claimed is:

1. An ophthalmic spectacle lens which is defined as a polarized spectacle lens, a photochromic spectacle lens, an active spectacle lens comprising an electroactive material, or a solar lens, comprising:
   an organic substrate having a front main face and a rear main face; and
   a multilayered interferential coating selected from an antireflection coating and a reflective coating which is coated on at least one of the front main face and the rear main face;
   wherein the multilayered interferential coating comprises at least one graphene layer which is formed from a graphene monolayer or a bilayer of graphene, and has a uniform thickness of between 0.1 nm to 1 nm; and
   wherein the multilayered interferential coating forms a stack comprising an alternation of:
   at least one high refractive layered unit of refraction index greater than 1.55, which comprises the at least one graphene layer and an underlying encapsulating layer of a thickness of between 5 nm and 85 nm over which the at least one graphene layer continuously extends, the at least one high refractive layered unit having a thickness of between 10 nm and 120 nm; and
   at least one low refractive layer of refraction index lower than 1.55 or a metallic layer; and
   wherein the multilayered interferential coating forms a stack consisting of inorganic dielectric thin layers, the at least one graphene layer and optionally the metallic layer.

2. The ophthalmic spectacle lens of claim 1, wherein the multilayered interferential coating comprises at least two said graphene layers.

3. The ophthalmic spectacle lens of claim 1, further comprising an overlying encapsulating layer beneath which the at least one graphene layer continuously extends.

4. The ophthalmic spectacle lens of claim 3, wherein each of the underlying encapsulating layer and the overlying encapsulating layer is based of boron nitride.

5. The ophthalmic spectacle lens of claim 3, wherein the at least one high refractive layered unit comprises the underlying encapsulating layer and the overlying encapsulating layer sandwiching a said graphene layer, the multilayered interferential coating successively comprising, in a direction moving away from the organic substrate, at least one unitary assembly of:
   one said high refractive layered unit; and
   one said low refractive layer which covers the said high refractive layered unit;
   and the multilayered interferential coating has a said high refractive layered unit as a bottom layer and one said low refractive layer as a top layer, and comprising a number of said unitary assembly(ies) ranging from 1 to 8.

6. The ophthalmic spectacle lens of claim 5, wherein the one said low refractive layer is based on SiO2 and has a thickness of between 10 nm and 180 nm, the multilayered interferential coating comprising a number of said unitary assembly(ies) ranging from 1 to 5.

7. The ophthalmic spectacle lens of claim 5, wherein the multilayered interferential coating forms a visible antireflection coating and/or an infrared reflective coating for a spectacle lens.

8. The ophthalmic spectacle lens of claim 7, wherein the multilayered interferential coating forms a visible antireflection coating having a mean light reflection factor in the visible region $R_v$ lower than or equal to 1.1% for an angle of incidence of 15°.

9. The ophthalmic spectacle lens of claim 7, wherein the multilayered interferential coating forms an infrared reflective coating having an IR reflection factor $R_{IR}$ measured across 780-2000 nm greater than or equal to 30%, measured at an angle of incidence of 15°.

10. The ophthalmic spectacle lens of claim 1, wherein the multilayered interferential coating successively comprises, in a direction moving away from the organic substrate:
    as a bottom layer, one lower said high refractive layered unit which comprises the underlying encapsulating layer and the overlying encapsulating layer sandwiching a said graphene layer;
    one said layer further defined as a low refractive layer or a metallic layer which covers the said lower high refractive layered unit; and
    as a top layer, one said graphene layer extending over one said underlying encapsulating layer to form an upper said high refractive layered unit which is devoid of a said overlying encapsulating layer;
    the number of said graphene layers in the multilayered interferential coating ranging from 1 to 8.

11. The ophthalmic spectacle lens of claim 10, wherein:
    said lower high refractive layered unit has a thickness of between 20 nm and 70 nm;
    the one said layer further defined as a low refractive layer or a metallic layer which covers the said lower high refractive layered unit is:
    a $SiO_2$ layer having a thickness of between 120 nm and 170 nm; or
    a metallic layer having a thickness of between 5 nm and 15 nm; and
    the upper said high refractive layered unit which is devoid of a said overlying encapsulating layer has a thickness of between 40 nm and 60 nm.

12. The ophthalmic spectacle lens of claim 10, wherein the multilayered interferential coating forms:
    (i) where said layer which covers the said lower high refractive layered unit is a low refractive $SiO_2$ layer, a visible reflective coating forming a mirror front surface of a spectacle lens; and
    (ii) where said layer which covers the said lower high refractive layered unit is a metallic layer selected from silver, gold and copper, a visible antireflection coating and/or an infrared reflective coating.

13. The ophthalmic spectacle lens of claim 12, wherein in case (i) the multilayered interferential coating forms a visible reflecting coating having a mean light reflection factor in the visible region $R_v$ greater than or equal to 20% for an angle of incidence of 15°.

14. The ophthalmic spectacle lens of claim 12, wherein in case (ii) the multilayered interferential coating forms:
- a visible antireflection coating having a mean light reflection factor in the visible region $R_v$, lower than or equal to 1% for an angle of incidence of 15°; and
- an infrared reflective coating having an IR reflection factor $R_{IR}$ measured across 780-2000 nm greater than or equal to 30%, measured at an angle of incidence of 15°.

15. The ophthalmic spectacle lens of claim 14, wherein the visible antireflection coating has a mean light reflection factor in the visible region Rv lower than or equal to 0.8% for an angle of incidence of 15°.

16. The ophthalmic spectacle lens of claim 14, wherein the infrared reflective coating has an IR reflection factor RIR measured across 780-2000 nm greater than or equal to 35%, measured at an angle of incidence of 15°.

17. The ophthalmic spectacle lens of claim 14, wherein in case (ii) the multilayered interferential coating forms:
- the visible antireflection coating having a mean light reflection factor in the visible region $R_v$, lower than or equal to 0.8% for an angle of incidence of 15°; and
- the infrared reflective coating having an IR reflection factor RIR measured across 780-2000 nm greater than or equal to 35%, measured at an angle of incidence of 15°.

18. The ophthalmic spectacle lens of claim 1, wherein the at least one graphene layer is formed from a graphene monolayer which has a thickness greater than or equal to 0.2 nm and less than 0.3 nm.

19. A method for manufacturing an ophthalmic spectacle lens, which is defined as a polarized spectacle lens, a photochromic spectacle lens, an active spectacle lens comprising an electroactive material, or a solar lens, comprising:
- obtaining an organic substrate having a front main face and a rear main face; and
- depositing by chemical vapor deposition a multilayered interferential coating selected from an antireflection coasting and a reflective coating on at least one of the front main face and the rear main face, the multilayered interferential coating comprising at least one graphene layer formed from a graphene monolayer or a bilayer of graphene, which has a uniform thickness of between 0.1 nm to 1 nm;
wherein the multilayered interferential coating forms a stack comprising an alternation of:
- at least one high refractive layered unit of refraction index greater than 1.55, which comprises the at least one graphene layer and an underlying encapsulating layer of a thickness of between 5 nm and 85 nm over which the at least one graphene layer continuously extends, the at least one high refractive layered unit having a thickness of between 10 nm and 120 nm; and
- at least one low refractive layer of refraction index lower than 1.55 or a metallic layer; and
wherein the multilayered interferential coating forms a stack consisting of inorganic dielectric thin layers, the at least one graphene layer and optionally the metallic layer.

* * * * *